United States Patent [19]

Haque et al.

[11] 4,431,986

[45] Feb. 14, 1984

[54] DIGITAL TO ANALOG AND ANALOG TO DIGITAL CONVERTERS WITH BIPOLAR OUTPUT SIGNALS

[75] Inventors: Yusuf A. Haque, San Jose; Vikram Saletore, Cupertino; Jeffrey A. Schuler, Saratoga, all of Calif.

[73] Assignee: American Microsystems, Incorporated, Santa Clara, Calif.

[21] Appl. No.: 310,156

[22] Filed: Oct. 9, 1981

[51] Int. Cl.³ .......................................... H03K 13/02
[52] U.S. Cl. ...................... 340/347 AD; 340/347 DA; 340/347 M
[58] Field of Search ................... 340/347 M, 347 DA; 307/451, 501

[56] References Cited

U.S. PATENT DOCUMENTS 3,217,147 11/1965 Chapman, Jr. .............. 340/347 DA
3,474,440 10/1966 Schmid ........................ 340/347 DA
4,045,793 8/1977 Moench ....................... 340/347 DA

OTHER PUBLICATIONS

The Engineering Staff of Analog Devices, Inc., Analog-Digital Conversion Handbook, 6/1972, pp. I-33 & 34; II-46 through II-48.

Primary Examiner—T. J. Sloyan
Attorney, Agent, or Firm—Alan H. MacPherson; Steven F. Caserza; Richard Franklin

[57] ABSTRACT

A digital to analog converter (100) utilizes a current mirror connected to a reference voltage ($V_{REF}$) to generate a constant reference current ($I_{REF}$). A voltage divider ($R_1$ and $R_2$) is used in conjunction with a plurality of MOS transistors ($X_1$-$X_N$) serving as current mirrors having specific current carrying capabilities which are controlled by selected binary digits (bits) of a digital signal. By the appropriate connection of desired ones of said plurality of MOS transistors, a specific fraction of said reference current is caused to flow through said plurality of MOS transistors. The amount of current flowing through said plurality of MOS transistors generates an output voltage ($V_{OUT}$) from the digital to analog converter of this invention. This output voltage may be positive or negative with respect to the reference voltage, thus the output voltage is bipolar.

7 Claims, 1 Drawing Figure

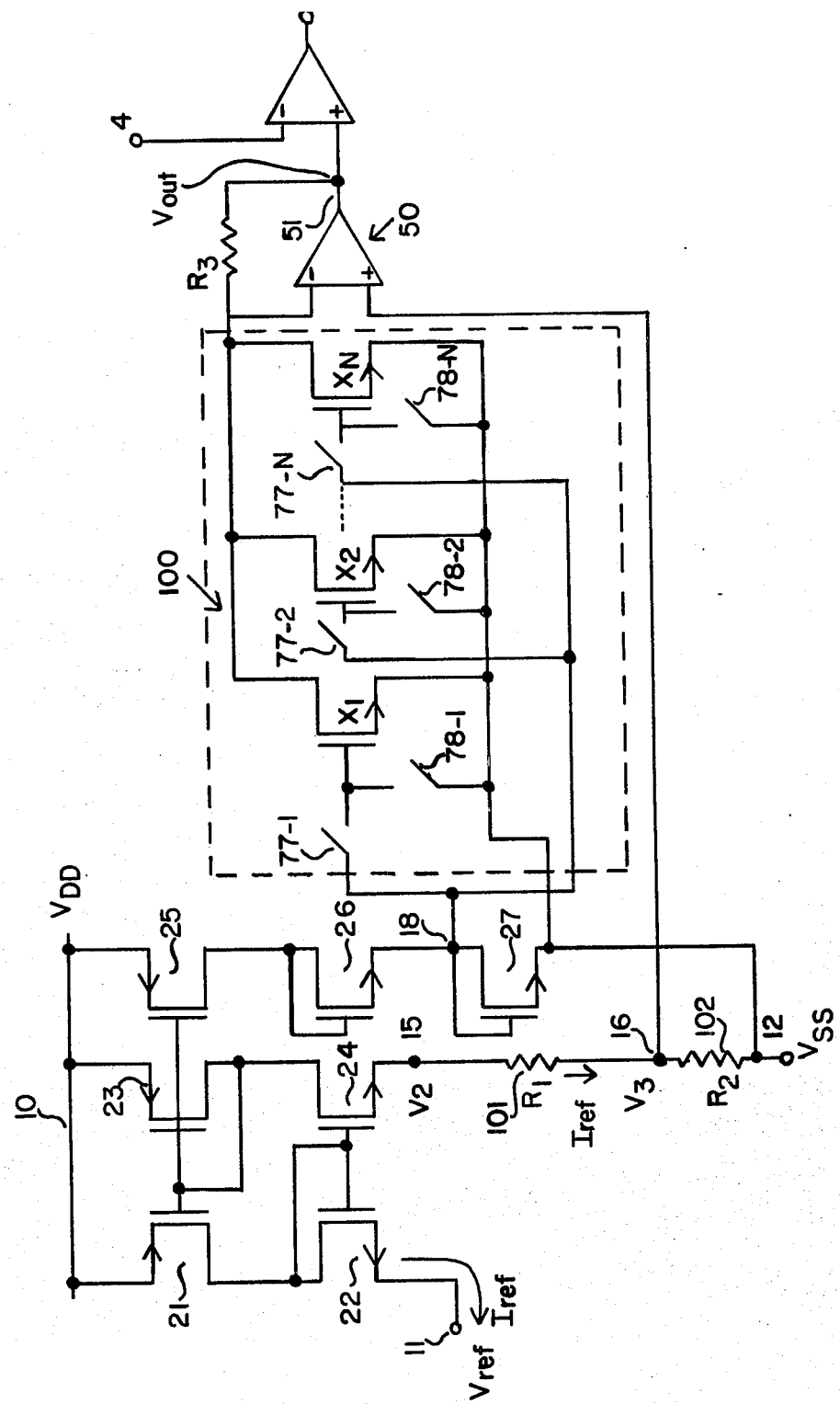

DIGITAL TO ANALOG AND ANALOG TO DIGITAL CONVERTERS WITH BIPOLAR OUTPUT SIGNALS

BACKGROUND OF THE INVENTION

1. Field of the Invention

This invention relates to electronic digital to analog converter circuits suitable for converting a digital signal to an analog signal, and analog to digital converter circuits capable of converting an analog signal to a digital representation of that analog signal.

2. Description of the Prior Art

Digital to analog converters and analog to digital converters are well known in the prior art. For example, one such digital to analog converter is disclosed in U.S. Pat. No. 4,384,274, which issued May 17, 1983 and which is assigned to American Microsystems, Inc., the assignee of this application. U.S. Pat. No. 4,384,274 is hereby incorporated by reference. The analog output signal of the digital to analog converter of this prior art circuit is unipolar in that the analog signal generated is always positive. Similarly, in the analog to digital converter disclosed in U.S. Pat. No. 4,384,274, the analog voltage to be converted must be of a single polarity. Such unipolar digital to analog and analog to digital converters cannot be used when it is desired to provide a bipolar analog output signal from a digital to analog converter, or when it is desired to provide a digital representation of a bipolar input signal applied to an analog to digital converter.

One attempt at solving this problem is disclosed in U.S. patent application Ser. No. 06/169,980, filed July 18, 1980, assigned to American Microsystems, Inc., and hereby incorporated by reference. This prior art invention uses a single reference voltage for comparing both positive and negative input signals applied to the analog to digital converter. This circuit utilizes a capacitor array and a plurality of three-way switches in order to convert a bipolar analog input voltage to a digital representation thereof. The use of a capacitor array generally requires a large surface area when the digital to analog or analog to digital converter is fabricated as a single integrated circuit semiconductor device, thus resulting in a rather large and expensive device compared to most linear integrated circuits.

SUMMARY

In accordance with this invention, a digital to analog converter utilizes a current mirror circuit connected to a reference voltage to generate a constant reference current. A voltage divider is used in conjunction with a plurality of MOS transistors serving as current mirrors to generate a wide range of current which is proportional to the reference current. The MOS transistors are controlled by selected binary digits (bits) of a digital signal and each transistor has a specific current carrying capability. By the application of appropriate binary control signals to selected ones of said plurality of MOS current mirroring transistors, a specific fraction of said reference current proportional to the channel widths of said selected current mirroring transistors is caused to flow through said selected ones of said plurality of MOS transistors. An output signal is generated from the digital to analog converter of this invention with a magnitude uniquely related to the amplitude of the current flowing through said selected MOS transistors. This output signal may be greater than or less than the reference voltage; thus, the output signal is bipolar with respect to the reference voltage.

In accordance with this invention, an analog to digital converter utilizes the digital to analog converter of this invention in conjunction with a standard comparator. A series of analog signals are generated by the digital to analog converter from a series of digital signals of different values. These analog signals are then compared to the analog input signal to be converted. The digital signal which provides an analog output signal from the digital to analog converter which is most nearly equal to the analog input signal is used as the digital output signal representing most closely the analog input signal. Of importance, due to the unique design of the analog to digital converter of this invention, the analog input signal to be converted to a digital signal may be either positive or negative with respect to the reference voltage utilized by the digital to analog converter of this invention. Thus, the analog to digital converter of this invention is bipolar.

BRIEF DESCRIPTION OF THE DRAWING

The sole FIGURE of this specification shows a schematic diagram of a digital to analog converter circuit constructed in accordance with this invention.

DETAILED DESCRIPTION

The digital to analog (D/A) converter of this invention is shown in the FIGURE. As shown, a reference voltage $V_{REF}$ is made available on node 11. This reference voltage $V_{REF}$ is generated in a well-known manner, and is generally also utilized by other circuitry (not shown) which is used in conjunction with the digital to analog converter of this invention. A positive supply voltage $V_{DD}$ is applied to lead 10. A negative supply voltage $V_{SS}$ is applied to node 12 (by "negative" is meant a lower voltage than $V_{DD}$). In one embodiment of this invention, $V_{SS}$ is ground (zero volts). In order to cause a reference current $I_{REF}$ to flow from $V_{DD}$ to node 11 through P channel transistor 21 and N channel transistor 22, $V_{REF}$ is a reference voltage whose value is between the negative supply voltage $V_{SS}$ and the positive supply voltage $V_{DD}$ such that:

$$(V_{SS}) \leq V_{REF} \leq (V_{DD} - 2V_T) \qquad (1)$$

where $V_T =$ the threshold voltage of MOSFETs 21, 22, 23 and 24.

Transistors 21, 22, 23 and 24 form a current mirror (i.e. a circuit in which the current flowing in a first leg causes a substantially equal current to flow in a second leg) which generates on node 15 a voltage $V_2$ equal to the previously mentioned reference voltage $V_{REF}$. The use of this current mirror allows a voltage $V_{REF}$ capable of providing adequate current to resistors $R_1$ and $R_2$ to be made available at node 15, while drawing minimal (and constant) current from $V_{REF}$ node 11, thus maintaining $V_{REF}$ at a highly constant value. The resistors $R_1$ and $R_2$ form a voltage divider which generates a second reference voltage, $V_3$, on node 16 whose value is between $V_{REF}$ and $V_{SS}$.

The operation of the current mirror formed by transistors 21, 22, 23 and 24 is as follows. Transistors 21 and 23 are well matched and transistors 22 and 24 are well matched, such that the electrical characteristics of transistors 21 and 23 (and 22 and 24) are closely balanced. Transistor 21 is a P channel MOSFET whose source is connected to $V_{DD}$ lead 10. The drain of MOSFET 21 is connected to the drain of N channel MOSFET 22, and the source of MOSFET 22 is connected to $V_{REF}$ at node 11. Similarly, the source of P channel MOSFET 23 is connected to $V_{DD}$ lead 10, and its drain is connected to the drain of N channel MOSFET 24. The source of N channel MOSFET 24 is connected to resistor $R_1$ at node 15. The gate of MOSFET 21 is connected to the gate of MOSFET 23 as well as to the drain of MOSFET 23. Similarly, the gate of MOSFET 22 is connected to the gate of MOSFET 24 as well as to the drain of MOSFET 22.

Upon the application of power ($V_{DD}$, $V_{SS}$, and $V_{REF}$) to the circuit, MOSFETs 21, 22, 23 and 24 are off, and their gates are essentially floating at zero volts. Thus, the gate to source voltage ($V_{GS}$) of P channel transistors 21 and 23 are negative, thus causing transistors 21 and 23 to turn on. This raises the voltage on the gates of N channel transistors 22 and 24 toward $V_{DD}$, thus turning transistors 22 and 24 on. Transistors 21, 22, 23 and 24 are designed to operate in saturation after turning on due to the application of $V_{DD}$, $V_{SS}$ and $V_{REF}$. In this manner, a current $I_{REF}$ is caused to flow from $V_{DD}$ lead 10 through MOSFETs 23 and 24 to node 15 and through resistors $R_1$ and $R_2$ to $V_{SS}$. Virtually no current flows from node 16 between resistors $R_1$ and $R_2$ to the noninverting input lead of comparator 50, due to the extremely high impedance of the input leads of operational amplifier 50. When MOSFETs 21, 22, 23 and 24 are operated in saturation, current $I_{ref}$ is determined by the saturation source to drain currents $I_D$ of transistors 23 and 24, which is controlled by the magnitudes of $V_{DD}$, $V_{SS}$, and $R_2$, where $$I_D = \frac{W}{L} K(V_{GS} - V_T)^2 \quad (2)$$

where
W = the width of the channel of the transistor
L = the length of the channel of the transistor
$V_{GS}$ = the gate to source voltage of the transistor
$V_T$ = the threshold voltage of the transistor; and
K = a constant.

In one embodiment of this invention, $V_{DD}$ = 12 volts, the channel lengths of P channel MOSFETs 21 and 23 are 20 microns, the channel widths of MOSFETs 21 and 23 are 300 microns, the channel lengths of N channel MOSFETs 22 and 24 are 8 microns, and the channel widths of MOSFETs 22 and 24 are 400 microns. The threshold voltages of MOSFETs 21, 22, 23 and 24 are approximately 1 volt. $V_{ref}$ is approximately 5.7 volts. Resistor $R_1$ is selected within the range of approximately 7.5K to 30K ohms and resistor $R_2$ is selected within the range of approximately 5K to 20K ohms, although other values of resistors $R_1$ and $R_2$ may be used when the geometries of transistors 21, 22, 23 and 24 are changed from the geometries described above. For the geometries set forth above, the variation of $R_1$ and $R_2$ within the ranges set forth results in a variation of $V_2$ relative to $V_{ref}$ of no greater than 20 millivolts. Preferably, resistor $R_1$ is 15K ohms and resistor $R_2$ is 10K ohms.

Because the channel width, channel length, threshold voltage and gate to source voltage of MOSFETs 21 and 23 (and MOSFETs 22 and 24) are equal, a current equal to $I_{REF}$ is made to flow through MOSFETs 21 and 22 from $V_{DD}$ lead 10 to node $V_{ref}$ 11.

Of importance, MOSFETs 21, 22, 23 and 24, are preferably constructed on the same piece of semiconductor material, and in close proximity to each other, in order that their electrical characteristics (such as threshold voltage and source to drain current) are closely matched. Such electrical characteristics are dependent on the channel width, the channel length and the doping characteristics of the channel, as well as the gate dielectric thickness.

Thus, two equal currents $I_{REF}$ flow from $V_{DD}$ lead 10 to $V_{REF}$ node 11 and from $V_{DD}$ lead 10 to $V_{SS}$ node 12. Because the impedance from the source of transistor 21 to the source of transistor 22 is equal to the impedance from the source of transistor 23 to the source of transistor 24 (due to the close matching of transistors 21, 22, 23, and 24, and equal current flow through transistors 21 and 22 and transistors 23 and 24), the voltage $V_2$ on node 15 is equal to $V_{REF}$. The voltage $V_3$ on node 16 is simply $$V_3 = V_{SS} + \frac{R_2}{R_1 + R_2}(V_2 - V_{SS}) \quad (3)$$

where
$R_1$ = the resistance of resistor $R_1$; and
$R_2$ = the resistance of resistor $R_2$.

In the embodiment of this invention in which $V_{SS}$ = 0 volts (ground), $$V_3 = \frac{R_2}{R_1 + R_2} V_2 \quad (4)$$

This voltage $V_3$ is applied to the noninverting input lead of comparator 50.

A second current mirror is formed by MOSFETs 21, 22, 25, 26, and 27. The source of P channel MOSFET 25 is connected to $V_{DD}$ lead 10, and the drain of MOSFET 25 is connected to the drain of N channel MOSFET 26. The source of MOSFET 26 is connected to the drain of N channel MOSFET 27, and the source of MOSFET 27 is connected to the negative supply voltage $V_{SS}$. The gate of MOSFET 25 is connected to the gate of MOSFET 21, and the gate of MOSFET 26 is connected to the drain of MOSFET 26. The gate of MOSFET 27 is connected to the drain of MOSFET 27. Thus, MOSFETs 26 and 27 serve as load devices between $V_{DD}$ and $V_{SS}$. Of importance, the width of the channel of MOSFET 25 is equal to twice the channel width of MOSFET 21, and the channel length of MOSFET 25 is equal to the channel length of MOSFET 21. MOSFETs 21 and 25 are closely matched such that their threshold voltages ($V_T$) are equal. Thus, from equation (2), with the same gate bias on the gate of MOSFET 25 as is on the gate of MOSFET 21, twice as much current will flow through the channel of MOSFET 25 as flows through the channel of MOSFET 21. Thus, a constant current equal to $2I_{REF}$ flows through MOSFETs 25, 26 and 27 from $V_{DD}$ lead 10 to $V_{SS}$ node 12.

The weighting elements of the digital to analog converter of this invention comprise weighting array 100 containing MOSFETs $X_1, X_2, \ldots X_N$. In one embodiment, the MOSFETs $X_1$ through $X_N$ are identical, therefore having the same electrical characteristics, including channel width and channel length. The effective channel width of array 100 may be selected by the application of appropriate control bits to operate switches 77 and 78 of weighting array 100, thus connecting the gate of MOSFET 27 to selected gates of MOSFETs $X_1$ through $X_N$, to be equal to KW, where K is an integer ranging from 0 to N, and W is the width of the channel of each MOSFET $X_1$ through $X_N$.

In another embodiment of this invention, MOSFETs $X_1$ through $X_N$ in array 100 are binary weighted, such that the channel length of each MOSFET $X_1$ through $X_N$ is equal and the channel width of MOSFET $X_j$ is equal to $2^{j-1}W$, where j ranges from 1 to N, and W is equal to the width of the narrowest channel in array 100. Similarly, any other desired weighting scheme may be used in constructing array 100, thus providing an analog output signal in response to a digital input signal in accordance with the weighting scheme of MOSFETs $X_1$ through $X_N$. The sum of the channel widths of all the MOSFETs $X_1$ through $X_N$ is equal to the channel width of MOSFET 27, thus causing a maximum current $2I_{REF}$ to be mirrored through MOSFETs $X_1$ through $X_N$ when all MOSFETs $X_1$ through $X_N$ are conducting due to the connection of the gate leads of MOSFETs $X_1$ through $X_N$ to the gate lead of MOSFET 27 at node 18.

Each MOSFET $X_1$ through $X_N$ within weighting array 100 has associated with it two switches for controlling the potential on its gate. For convenience, only the operation of the switches associated with MOSFET $X_1$ is explained, but it is to be understood that the switches associated with MOSFETS $X_2$ through $X_N$ operate in an identical fashion. In the embodiment shown, MOSFETs $X_1$ through $X_N$ are N channel devices. Switches 77-1 and 78-1 (preferably MOSFET devices of well known design) are controlled by control signals (not shown), such that when switch 77-1 is closed, switch 78-1 is open and vice versa. When it is desired to turn MOSFET $X_1$ on, switch 77-1 closes and switch 78-1 opens, thus applying the gate voltage of MOSFET 27 from node 18 to the gate of MOSFET $X_1$ thereby turning on this normally off transistor. With MOSFET $X_1$ turned on, current flows from output node 51 of operational amplifier 50, through resistor $R_3$ to the drain of MOSFET $X_1$, to the source of MOSFET $X_1$ to $V_{SS}$. When it is desired to turn MOSFET $X_1$ off, switch 77-1 opens and switch 78-1 closes, thus connecting the gate electrode of MOSFET $X_1$ to $V_{SS}$, thus preventing current flow through MOSFET $X_1$. Preferably, switches 77-1 and 78-1, as well as the remaining switches contained within array 10, are MOSFET devices. Alternatively, any other means capable of operating as a switch may be used. Because MOSFETs $X_1$ through $X_N$ mirror the current flowing through MOSFET 27 and the channel length of transistor 27 and transistors $X_1$ through $X_N$ are equal, the current through each MOSFET $X_1$ through $X_N$ will be proportional to the current through MOSFET 27 according to the following relationship:

$$I_j = \frac{W_j}{W_{27}} I_{27}, \quad (5)$$

where $I_j$ = the current through MOSFET $X_j$ when MOSFET $X_j$ is conducting;

J = an integer ranging from 1 to N, where N is the number of MOSFETs in array 100;

$I_{27}$ = the current through MOSFET 27, which is equal to $2I_{ref}$;

$W_j$ = the channel width of MOSFET $X_j$; and $W_{27}$ = the channel width of MOSFET 27.

With all MOSFETs $X_1$ through $X_N$ within weighting array 100 turned off, no current flows through resistor $R_3$ (having a resistance of $R_3 = R_1$). Thus, the output voltage $V_{OUT}$ on node 51 will be equal to $V_3$, the voltage applied to noninverting input lead of operational amplifier 50. Similarly, when all MOSFETs $X_1$ through $X_N$ within array 100 are conducting (i.e., switches 77-1 through 77-N closed and switches 78-1 through 78-N open), the sum of the channel widths of MOSFETs $X_1$ through $X_N$ is equal to the channel width of MOSFET 27 and a total of $2I_{REF}$ will be drawn through MOSFETs $X_1$ through $X_N$. Thus, the output voltage $V_{out}$ on node 51 will be equal to $V_3 + 2I_{REF}R_3$. Thus, the output voltage $V_{OUT}$ may range between $V_3$ and $V_3 + 2I_{REF}R_3$, and is dependent on the state (on or off) of each MOSFET $X_1$ through $X_N$. The midpoint of this range is equal to $V_3 + I_{REF}R_3$. However, $$I_{REF} = \frac{V_2 - V_{SS}}{R_1 + R_2} \quad (6)$$

$$V_3 = \frac{(V_2 - V_{SS})R_2}{R_1 + R_2} + V_{SS}; \text{ and} \quad (7)$$

$$R_1 = R_3. \quad (8)$$

Thus, $V_{OUT}$ at the midpoint of its voltage range (i.e., the sum of the channel widths of transistors $X_1$ through $X_N$ which are conducting is equal to one-half the channel width of transistor 27, and a total current equal to $I_{REF}$ is flowing through transistors $X_1$ through $X_N$) is equal to:

$$V_{OUT} = V_3 + I_{REF}R_3 \quad (9)$$

$$V_{OUT} = \frac{(V_2 - V_{SS})R_2}{R_1 + R_2} + V_{SS} + \frac{(V_2 - V_{SS})R_1}{R_1 + R_2} \quad (10)$$

$$V_{OUT} = V_2 = V_{REF}. \quad (11)$$

Thus, utilizing the digital to analog converter of this invention, the output voltage $V_{OUT}$ from the digital to analog converter may range both above and below the reference voltage $V_{REF}$ utilized by the system in which the digital to analog converter of this invention is used. Hence, the output voltage $V_{OUT}$ is bipolar with respect to the reference voltage $V_{REF}$. Furthermore, the use of weighting array 100 allows a significant reduction in the size of the digital to analog converter of this invention as compared to prior art digital to analog converters utilizing a capacitor array as the weighting mechanism.

An analog to digital converter is constructed in accordance with this invention by utilizing, for example, a successive approximation register (SAR) which generates a series of binary signals which successively approach the binary signal representing the analog signal being converted and a comparator in conjunction with the digital to analog converter of this invention. The use of such a successive approximation register and operational amplifier in conjunction with a digital to analog converter is described in U.S. Pat. No. 4,384,274, and U.S. patent application Ser. No. 183,171 filed Sept. 2, 1980, which are assigned to the assignee of this application, and in "Operational Amplifiers Design and Applications", Graeme et al. published by McGraw-Hill Book Company, 1971 at page 344 all of which are hereby incorporated by reference. Alternatively, other analog-to-digital conversion techniques such as the "counter ramp analog-to-digital converter" and the "continuous counter ramp analog-to-digital converter", which are described by Graeme, et al. on pages 342–344 of their aforementioned book, may be used in conjunction with the digital-to-analog converter of this invention.

The use of the digital to analog converter of this invention in an analog to digital converter allows the analog to digital conversion of input voltages which are positive with respect to the reference voltage, as well as the analog to digital conversion of input voltages which are negative with respect to the reference voltage. Thus, the analog to digital converter of this invention allows the analog to digital conversion of bipolar input voltages, with the reduced circuit size and cost associated with the use of current mirroring transistors $X_1$ through $X_N$, as compared to the circuit size of prior art analog to digital converters using capacitor arrays.

While specific embodiments of this invention have been described, it is to be understood that numerous embodiments are possible in light of this disclosure, and the embodiments described herein are not in any way a limitation of the scope of this invention.

We claim:

1. A digital to analog converter with bipolar output signals responsive to a first reference voltage and a digital word for generating an output voltage within a range of output voltages having a midpoint value equal to the value of the first reference voltage, which comprises:
   a first lead for the reception of a first supply voltage;
   a second lead for the reception of a second supply voltage;
   a third lead for the reception of a first reference voltage, said reference voltage having a value between said first supply voltage and said second supply voltage;
   an operational amplifier having an inverting input lead, a noninverting input lead and an output lead;
   means for generating a second reference voltage and applying said second reference voltage to said noninverting input lead of said operational amplifier;
   a load connected between said output lead and said inverting input lead of said operational amplifier;
   means for generating a reference current from said first reference voltage;
   a plurality of N current mirroring devices for mirroring said reference current, where N is a selected integer equal to the maximum number of current mirroring devices, said plurality of N current mirroring devices being connected between said inverting input lead of said operational amplifier and said second supply voltage;
   wherein the output voltage on said output lead of said operational amplifier is determined by the conduction of each of said N current mirroring devices, and the midpoint of the range of said output voltage is equal to said first reference voltage.

2. An analog-to-digital converter comprising a digital-to-analog converter, means for generating a binary number, means for applying said binary number to said digital-to-analog converter, thereby causing said digital-to-analog converter to generate an output voltage, means for comparing said output voltage with an analog input voltage applied to said analog-to-digital converter, and means for providing a digital output signal equal to said binary number when said output voltage of said digital-to-analog converter is substantially equal to said analog input voltage, wherein said digital-to-analog converter is responsive to a first reference voltage and a digital word for generating an output voltage within a range of output voltages having a midpoint value equal to the value of the first reference voltage, and comprises:
   a first lead for the reception of a first supply voltage;
   a second lead for the reception of a second supply voltage;
   a third lead for the reception of a first reference voltage, said reference voltage having a value between said first supply voltage and said second supply voltage;
   an operational amplifier having an inverting input lead, a noninverting input lead and an output lead;
   means for generating a second reference voltage and applying said second reference voltage to said noninverting input lead of said operational amplifier;
   a load connected between said output lead and said inverting input lead of said operational amplifier;
   means for generating a reference current from said first reference voltage;
   a plurality of N current mirroring devices for mirroring said reference current, where N is a selected integer equal to the maximum number of current mirroring devices, said plurality of N current mirroring devices being connected between said inverting input lead of said operational amplifier and said second supply voltage;
   wherein the output voltage on said output lead of said operational amplifier is determined by the conduction of each of said N current mirroring devices, and the midpoint of the range of said output voltage is equal to said first reference voltage.

3. Structure as in claims 1 or 2 wherein said means for generating said second reference voltage comprises:
   means for mirroring said reference current; and
   a voltage divider;
   and wherein said second reference voltage is between said first reference voltage and said second supply voltage.

4. Structure as in claims 1 or 2 wherein the sum of the current mirroring abilities of said current mirroring elements is equal to the current being mirrored.

5. Structure as in claim 4 wherein the said current mirroring elements are MOSFETs.

6. Structure as in claim 5 wherein the channel width and length of each of said N current mirroring elements are equal.

7. Structure as in claim 5 wherein the channel lengths of each said N current mirroring elements are equal and the channel widths of said N current mirroring elements are binary weighted, whereby:

$$W_j = 2^{j-1} W_1,$$

where
   $W_j$ = the channel width of the jth current mirroring element, where j is an integer such that $1 \leq J \leq N$;
   $W_1$ = the channel width of the first current mirroring element.

* * * * *

UNITED STATES PATENT AND TRADEMARK OFFICE
CERTIFICATE OF CORRECTION

PATENT NO. : 4,431,986
DATED : February 14, 1984
INVENTOR(S) : Yusuf A. Haque, et al.

It is certified that error appears in the above—identified patent and that said Letters Patent is hereby corrected as shown below:

Column 3, line 31, after "$V_{SS}$," insert --$R_1$--.

Signed and Sealed this

Fifteenth Day of May 1984

[SEAL]

Attest:

*Attesting Officer*

GERALD J. MOSSINGHOFF
*Commissioner of Patents and Trademarks*